US012761570B2

(12) United States Patent
Pio et al.

(10) Patent No.: US 12,761,570 B2
(45) Date of Patent: Oct. 13, 2026

(54) MULTI-OVERLAY STACKED GRATING METROLOGY TARGET

(71) Applicant: KLA Corporation, Milpitas, CA (US)

(72) Inventors: Jordan Pio, Milpitas, CA (US); Yuval Lubashevsky, Haifa (IL); Itay Gdor, Tel-Aviv (IL); Nickolai Isakovitch, Tel-Aviv (IL)

(73) Assignee: KLA Corporation, Milpitas, CA (US)

( * ) Notice: Subject to any disclaimer, the term of this patent is extended or adjusted under 35 U.S.C. 154(b) by 9 days.

(21) Appl. No.: 18/230,542

(22) Filed: Aug. 4, 2023

(65) Prior Publication Data

US 2024/0302751 A1 Sep. 12, 2024

Related U.S. Application Data

(60) Provisional application No. 63/450,975, filed on Mar. 9, 2023.

(51) Int. Cl.
*G03F 7/00* (2006.01)

(52) U.S. Cl.
CPC ...... *G03F 7/70633* (2013.01); *G03F 7/70683* (2013.01); *G03F 7/706843* (2023.05)

(58) Field of Classification Search
CPC ............... G03F 7/70633; G03F 7/7065; G03F 7/70683; G03F 7/706843; G03F 7/70681; G03F 7/70653; H01L 22/12; G01B 11/24; G01B 11/27; G01B 11/272; G01B 11/14; G01B 11/26; G01B 9/02041; G01B 9/02043; G01B 9/02083; G01B 9/02085; G01B 9/02087; G01N 21/9501; G01N 21/4788; G01N 21/956
See application file for complete search history.

(56) References Cited

U.S. PATENT DOCUMENTS

| | | | |
|---|---|---|---|
| 4,947,413 | A | 8/1990 | Jewell et al. |
| 5,216,257 | A | 6/1993 | Brueck et al. |
| 5,414,514 | A | 5/1995 | Smith et al. |
| 5,563,702 | A | 10/1996 | Emery et al. |

(Continued)

FOREIGN PATENT DOCUMENTS

| | | | |
|---|---|---|---|
| CN | 104346808 | A | 2/2015 |
| CN | 111766764 | A | 10/2020 |

(Continued)

OTHER PUBLICATIONS

U.S. Appl. No. 00017708958, filed Mar. 30, 2022, Manassen et al.

(Continued)

*Primary Examiner* — Gordon J Stock, Jr.
(74) *Attorney, Agent, or Firm* — Suiter Swantz IP

(57) ABSTRACT

An overlay metrology target includes a multi-layer grating structure formed as an overlapping grating structure with different pitches on three or more layers of a sample. The three or more layers of the sample may include at least a first layer, a second layer, and a third layer, where the overlapping grating structure is periodic along at least one of the scan direction or a direction orthogonal to the scan direction. The multi-layer grating structure may include a first-layer grating on the first layer with a first pitch, a second-layer grating on the second layer with a second pitch, and a third-layer grating on the third layer with a third pitch.

10 Claims, 9 Drawing Sheets

(56) References Cited

U.S. PATENT DOCUMENTS

| | | | | |
|---|---|---|---|---|
| 5,808,731 | A | 9/1998 | Kirk | |
| 5,822,055 | A | 10/1998 | Tsai et al. | |
| 5,895,735 | A | 4/1999 | Yoon | |
| 5,914,204 | A | 6/1999 | Lee | |
| 6,958,819 | B1 | 10/2005 | Heaton et al. | |
| 6,982,793 | B1 * | 1/2006 | Yang | G03F 7/70633 356/401 |
| 7,046,361 | B1 | 5/2006 | Yang et al. | |
| 7,247,843 | B1 | 7/2007 | Moon | |
| 7,254,792 | B1 | 8/2007 | Rekhi et al. | |
| 7,440,105 | B2 | 10/2008 | Adel et al. | |
| 7,528,941 | B2 | 5/2009 | Kandel et al. | |
| 7,602,491 | B2 | 10/2009 | Kandel et al. | |
| 7,671,990 | B1 | 3/2010 | Adel et al. | |
| 8,520,212 | B2 | 8/2013 | Coene et al. | |
| 8,786,825 | B2 | 7/2014 | Kerkhof et al. | |
| 9,123,649 | B1 | 9/2015 | Manassen et al. | |
| 9,739,702 | B2 | 8/2017 | Bringoltz et al. | |
| 9,864,209 | B2 | 1/2018 | Levinski et al. | |
| 9,885,961 | B1 | 2/2018 | Amir | |
| 9,929,104 | B2 * | 3/2018 | Park | H10W 46/00 |
| 10,197,389 | B2 | 2/2019 | Levinski et al. | |
| 10,268,125 | B2 | 4/2019 | Peng et al. | |
| 10,437,163 | B2 | 10/2019 | Schaar et al. | |
| 10,488,768 | B2 | 11/2019 | Auer et al. | |
| 10,527,952 | B2 * | 1/2020 | Grunzweig | G03F 7/70683 |
| 10,551,749 | B2 * | 2/2020 | Levinski | G03F 7/70625 |
| 10,571,811 | B2 * | 2/2020 | Amit | G03F 7/70633 |
| 10,585,357 | B2 | 3/2020 | Schaar et al. | |
| 10,606,178 | B2 | 3/2020 | Zwier | |
| 10,691,030 | B2 | 6/2020 | Staals et al. | |
| 10,802,409 | B2 * | 10/2020 | Fan | G03F 7/70633 |
| 10,824,079 | B2 | 11/2020 | Lubashevsky et al. | |
| 10,983,005 | B2 | 4/2021 | Wu et al. | |
| 11,073,768 | B2 | 7/2021 | Hill et al. | |
| 11,085,754 | B2 * | 8/2021 | Amit | G01B 11/06 |
| 11,112,369 | B2 | 9/2021 | Gready | |
| 11,119,417 | B2 | 9/2021 | Manassen et al. | |
| 11,164,307 | B1 | 11/2021 | Feler et al. | |
| 11,248,905 | B2 * | 2/2022 | Amit | G06N 99/00 |
| 11,300,405 | B2 | 4/2022 | Manassen et al. | |
| 11,300,524 | B1 | 4/2022 | Hill et al. | |
| 11,353,799 | B1 | 6/2022 | Volkovich et al. | |
| 11,355,375 | B2 * | 6/2022 | Volkovich | H01L 21/682 |
| 11,378,394 | B1 | 7/2022 | Paskover et al. | |
| 11,409,205 | B2 | 8/2022 | Gdor et al. | |
| 11,428,642 | B2 | 8/2022 | Hill et al. | |
| 11,526,086 | B2 | 12/2022 | Hill et al. | |
| 11,531,275 | B1 * | 12/2022 | Hill | G03F 7/70491 |
| 11,604,149 | B2 | 3/2023 | Feler | |
| 11,640,116 | B2 * | 5/2023 | Den Boef | G03F 7/70616 355/72 |
| 11,796,925 | B2 | 10/2023 | Lubashevsky et al. | |
| 12,105,433 | B2 * | 10/2024 | Feler | G03F 7/70633 |
| 12,216,412 | B2 * | 2/2025 | Hsieh | G03F 7/70633 |
| 12,235,588 | B2 * | 2/2025 | Manassen | G01B 9/02084 |
| 2001/0021477 | A1 | 9/2001 | Dirksen et al. | |
| 2002/0033952 | A1 | 3/2002 | Hill | |
| 2002/0080364 | A1 | 6/2002 | Monshouwer et al. | |
| 2004/0101983 | A1 | 5/2004 | Jones et al. | |
| 2004/0133369 | A1 | 7/2004 | Pack et al. | |
| 2004/0169861 | A1 | 9/2004 | Mieher et al. | |
| 2005/0012928 | A1 | 1/2005 | Sezginer et al. | |
| 2005/0195398 | A1 | 9/2005 | Adel et al. | |
| 2006/0117293 | A1 * | 6/2006 | Smith | H01L 23/544 257/E23.179 |
| 2007/0077503 | A1 | 4/2007 | Yoo | |
| 2007/0234786 | A1 | 10/2007 | Moon | |
| 2007/0242272 | A1 | 10/2007 | Suehira et al. | |
| 2007/0279630 | A1 | 12/2007 | Kandel et al. | |
| 2009/0042108 | A1 | 2/2009 | Yasuzato | |
| 2009/0195768 | A1 | 8/2009 | Bijnen et al. | |
| 2010/0123886 | A1 | 5/2010 | Bijnen et al. | |
| 2010/0267682 | A1 | 10/2010 | Johri et al. | |
| 2010/0277706 | A1 | 11/2010 | Schaar et al. | |
| 2011/0122496 | A1 | 5/2011 | Schaar et al. | |
| 2012/0033193 | A1 | 2/2012 | Schaar et al. | |
| 2012/0069337 | A1 | 3/2012 | Ishigo | |
| 2012/0253325 | A1 | 10/2012 | Sniffin et al. | |
| 2013/0032712 | A1 | 2/2013 | Shih et al. | |
| 2013/0193602 | A1 | 8/2013 | Suzuki et al. | |
| 2013/0252429 | A1 | 9/2013 | Okamoto et al. | |
| 2014/0065736 | A1 | 3/2014 | Amir et al. | |
| 2014/0240704 | A1 | 8/2014 | Komine et al. | |
| 2015/0138523 | A1 | 5/2015 | Jak et al. | |
| 2015/0177135 | A1 | 6/2015 | Amit et al. | |
| 2015/0204664 | A1 * | 7/2015 | Bringoltz | G02B 27/4255 356/508 |
| 2015/0235880 | A1 | 8/2015 | Inada et al. | |
| 2015/0292877 | A1 * | 10/2015 | Marciano | G06F 30/398 716/52 |
| 2015/0293458 | A1 | 10/2015 | Vanoppen et al. | |
| 2015/0308817 | A1 * | 10/2015 | Li | G03F 7/70466 356/401 |
| 2016/0047744 | A1 | 2/2016 | Adel et al. | |
| 2016/0061589 | A1 * | 3/2016 | Bhattacharyya | G01B 11/14 356/620 |
| 2016/0071260 | A1 | 3/2016 | Azordegan et al. | |
| 2016/0093574 | A1 | 3/2016 | Cai et al. | |
| 2016/0123894 | A1 | 5/2016 | Fu et al. | |
| 2016/0146740 | A1 | 5/2016 | Lu et al. | |
| 2016/0223920 | A1 | 8/2016 | Tinnemans et al. | |
| 2016/0300767 | A1 | 10/2016 | Ko et al. | |
| 2016/0334716 | A1 | 11/2016 | Mieher | |
| 2017/0146338 | A1 | 5/2017 | Allen | |
| 2017/0307367 | A1 | 10/2017 | Yaegashi et al. | |
| 2017/0351184 | A1 | 12/2017 | Peng et al. | |
| 2018/0024054 | A1 * | 1/2018 | Moon | G03F 7/70633 382/181 |
| 2018/0090296 | A1 | 3/2018 | Neil et al. | |
| 2018/0094978 | A1 | 4/2018 | Neil et al. | |
| 2018/0188663 | A1 | 7/2018 | Levinski et al. | |
| 2018/0246420 | A1 | 8/2018 | Pandey et al. | |
| 2018/0373167 | A1 | 12/2018 | Grunzweig et al. | |
| 2019/0004439 | A1 | 1/2019 | Lubashevsky et al. | |
| 2019/0033726 | A1 | 1/2019 | Adam et al. | |
| 2019/0049373 | A1 | 2/2019 | Levinski | |
| 2019/0101835 | A1 | 4/2019 | Chen | |
| 2019/0219931 | A1 | 7/2019 | Zwier | |
| 2019/0279841 | A1 | 9/2019 | Xiao | |
| 2019/0285996 | A1 | 9/2019 | Shibayama et al. | |
| 2019/0310080 | A1 | 10/2019 | Hill et al. | |
| 2019/0317413 | A1 | 10/2019 | Cheng et al. | |
| 2019/0354024 | A1 | 11/2019 | Tsiatmas et al. | |
| 2019/0378012 | A1 | 12/2019 | Tripodi et al. | |
| 2020/0050114 | A1 | 2/2020 | Bozkurt et al. | |
| 2020/0132446 | A1 | 4/2020 | Shalibo et al. | |
| 2020/0233317 | A1 | 7/2020 | Ausschnitt et al. | |
| 2020/0241429 | A1 | 7/2020 | Yang et al. | |
| 2020/0409271 | A1 | 12/2020 | Hill et al. | |
| 2021/0072650 | A1 | 3/2021 | Feler et al. | |
| 2021/0233821 | A1 * | 7/2021 | Feler | G03F 7/70683 |
| 2021/0364279 | A1 | 11/2021 | Manassen et al. | |
| 2021/0364935 | A1 | 11/2021 | Gdor et al. | |
| 2022/0034652 | A1 * | 2/2022 | Manassen | G03F 7/70633 |
| 2022/0252990 | A1 | 8/2022 | Javaheri et al. | |
| 2022/0328365 | A1 | 10/2022 | Manassen et al. | |
| 2023/0064193 | A1 * | 3/2023 | Tinnemans | G03F 7/7065 |
| 2023/0133640 | A1 | 5/2023 | Hill et al. | |
| 2023/0213875 | A1 | 7/2023 | Lubashevsky et al. | |
| 2023/0314319 | A1 | 10/2023 | Manassen et al. | |
| 2023/0314344 | A1 | 10/2023 | Paskover et al. | |
| 2024/0004310 | A1 * | 1/2024 | Blanton | G03F 7/70633 |
| 2024/0142883 | A1 * | 5/2024 | Reddy | G03F 7/70633 |
| 2024/0167813 | A1 * | 5/2024 | Gdor | G01B 11/272 |

FOREIGN PATENT DOCUMENTS

| | | | |
|---|---|---|---|
| EP | 0532927 | A2 | 3/1993 |
| JP | 214765 | Y1 | 8/1998 |
| JP | 10214765 | A | 11/1998 |
| JP | 2001093820 | A | 4/2001 |
| JP | 2002134394 | A | 5/2002 |

(56) References Cited

FOREIGN PATENT DOCUMENTS

| | | | | | |
|---|---|---|---|---|---|
| JP | 2007140460 | | | 2/2009 | |
| JP | 2010267682 | A | | 11/2010 | |
| JP | 2011243664 | A | | 12/2011 | |
| JP | 2012253325 | A | | 12/2012 | |
| JP | 2013074258 | A | | 4/2013 | |
| JP | 2013254780 | | | 7/2015 | |
| JP | 2015154008 | A | | 8/2015 | |
| KR | 101185992 | B1 | | 9/2012 | |
| KR | 20150121275 | A | | 10/2015 | |
| KR | 1020160121206 | A | | 10/2016 | |
| WO | 2017125352 | A1 | | 7/2017 | |
| WO | 2021012792 | A1 | | 1/2021 | |
| WO | 2021023792 | A1 | | 2/2021 | |
| WO | WO-2023035658 | A1 | * | 3/2023 | H10P 76/00 |
| WO | WO-2025153300 | A1 | * | 7/2025 | G03F 7/70683 |

OTHER PUBLICATIONS

U.S. Appl. No. 00017709200, filed Mar. 30, 2022, Paskover et al.
U.S. Appl. No. 00018099798, filed Jan. 20, 2023, Gdor et al.
U.S. Appl. No. 00018110746, filed Feb. 16, 2023, Manassen et al.
Korean Intellectual Property Office, International Search Report and Written Opinion received in International Application No. PCT/US2023/036069, Feb. 20, 2024, 8 pages.
U.S. Appl. No. 00018099798, filed Jan. 20, 2023, Itay Gdor.
U.S. Appl. No. 00018110746, filed Feb. 16, 2023, Amnon Manassen.
U.S. Appl. No. 00018234773, filed Aug. 16, 2023, Yuval Lubashevsky.
U.S. Appl. No. 00018372444, filed Sep. 25, 2023, Itay Gdor.
U.S. Appl. No. 00018372531, filed Sep. 25, 2023, Itay Gdor.
Adel et al., "Diffraction order control in overlay metrology: a review of the roadmap options," Proc. SPIE. 6922, Metrology, Inspection, and Process Control for Microlithography XXII, pp. 692202-1 to 692202-19, Apr. 2008.
Buttgereit, et al., "Phame(R)—high resolution off-axis phase shift measurements on 45nm node features," 24th European Mask and Lithography Conference, 2008, pp. 1-7, doi: 10.1117/12.798805.
Di, et al., "Moiré-Based Absolute Interferometry With Large Measurement Range in Wafer-Mask Alignment", IEEE Photonics Technology Letters, vol. 27, No. 4, pp. 435-438, 2015. doi:10.1109/LPT.2014.2377037.
Fesperman Jr., Ronnie Rex, (2006). Multiscale Alignment and Positioning System. (UMI 3264369) [Doctor of Philosophy, University of North Carolina] ProQuest Information and Learning Company.
International Search Report and Written Report in International Application No. PCT/US2021/061296 dated Mar. 24, 2022, 9 pages.
Kikuchi et al., "Principle and observation of fluorescence moire fringes for alignment in print and imprint methods" J. Vac. Sci. Technol. B 35, 06G303 (2017); https://doi.org/10.1116/1.4990844, Submitted: Jun. 19, 2017 . Accepted: Aug. 31, 2017 . Published Online: Sep. 26, 2017.
Korean Intellectual Property Office, International Search Report and Written Opinion for International Application No. PCT/US2022/052061, Apr. 24, 2023, 10 pages.
Korean Intellectual Property Office, International Search Report and Written Opinion for International Application No. PCT/US2023/013654, Jun. 8, 2023, 12 pages.
Korean Intellectual Property Office, International Search Report and Written Opinion for International Application No. PCT/US2023/014005, Jun. 16, 2023, 8 pages.
Moon, et al., "Immunity to Signal Degradation by Overlayers Using a Novel Spatial-Phase-Matching Alignment System", J. Vac. Sci. Technol. B 13, 2648-2652 (1995).
PCT International Search Report and Written Opinion for International Application No. PCT/US2021/044111 dated Nov. 22, 2022, 9 pages.
Servin, et al., "Mask contribution on CD & OVL errors budgets for Double Patterning Lithography," 25th European Mask and Lithography Conference, 2009, pp. 1-13.
Wu, et al., (2012). Nanoimprint lithography with ≤60 nm overlay precision. Applied Physics A, 106, 767-772.
Zhou, et al., (2015). Moiré-Based Interferometry for Magnification Calibration of Bitelecentric Lens System. IEEE Photonics Journal. 7. 1-11. 10.1109/JPHOT.2015.2500892.
Zhou, et al., "Fourier-based analysis of moire fringe patterns of superposed gratings in alignment of nanolithography", Optics Express, vol. 16, No. 11, p. 7869, 2008. doi: 10.1364/OE.16.007869.
Zhu et al. Four-quadrant gratings moire fringe alignment measurement in proximity lithography. Optics Express. Feb. 2013;21(3):3463-3473. DOI: 10.1364/OE.21.003463. PMID: 23481804.
Zhu, et al., (2015). Adjustment Strategy for Inclination Moire Fringes in Lithography by Spatial Frequency Decomposition. IEEE Photonics Technology Letters. 27. 395-398. 10.1109/LPT.2014.2370072.
Korean Intellectual Property Office, International Search Report and Written Opinion received in International Application No. PCT/US2024/018577, Jul. 2, 2024, 9 pages.
Zhou et al., "Moiré-Based Interferometry for Magnification Calibration of Bitelecentric Lens System," IEEE Photonics Journal, vol. 7, No. 6, Dec. 2015, 12 pages.

* cited by examiner

MULTI-OVERLAY STACKED GRATING METROLOGY TARGET

CROSS-REFERENCE TO RELATED APPLICATIONS

The present applicant claims the benefit under 35 U.S.C. § 119(e) of U.S. Provisional Application Ser. No. 63/450,975, filed Mar. 9, 2023, which is incorporated herein by reference in the entirety.

TECHNICAL FIELD

The present disclosure relates generally to overlay metrology and, more particularly, to scanning scatterometry overlay metrology.

BACKGROUND

Overlay metrology generally refers to measurements of the relative alignment of layers on a sample such as, but not limited to, semiconductor devices. An overlay measurement, or a measurement of overlay error, typically refers to a measurement of the misalignment of fabricated features on two or more sample layers. In a general sense, proper alignment of fabricated features on multiple sample layers is necessary for proper functioning of the device.

Demands to decrease feature size and increase feature density are resulting in correspondingly increased demand for accurate and efficient overlay metrology systems. Metrology systems typically generate metrology data associated with a sample by measuring or otherwise inspecting overlay metrology targets distributed across the sample.

Overlay metrology targets are typically designed to provide diagnostic information regarding the alignment of multiple layers of a sample by characterizing an overlay target having target features located on sample layers of interest. Further, the overlay alignment of the multiple layers is typically determined by aggregating overlay measurements of multiple overlay targets at various locations across the sample.

Some overlay metrology targets include multiple single overlay targets measured sequentially (e.g., scatterometry overlay (SCOL) metrology targets or Moiré fringe metrology targets). Such metrology targets (e.g., SCOL metrology targets or Moiré fringe metrology targets) include periodic structures configured to produce diffraction patterns that may be analyzed to determine metrology measurements. Such metrology targets (e.g., SCOL metrology targets or Moiré fringe metrology targets) containing a plurality of cells occupy a larger surface area of a sample, and throughput of measurements are reduced as measurement time scales with each additional overlay metrology target to measure.

Additional metrology targets (e.g., imaging AIM metrology targets) include features in multiple layers which are spatially separated in the plane of the sample and arranged to have a common center of symmetry, where overlay is measurement by the difference in the centers of symmetry between the layer-pairs of interest. Such metrology targets (e.g., imaging AIM metrology targets) require greater space on the sample. Additionally, it may be difficult to obtain optimal imaging conditions for the multiple layers simultaneously in a single image data collection due to different optical properties of each layer.

Therefore, it is desirable to provide systems and methods for curing the above deficiencies.

SUMMARY

An overlay metrology system is disclosed, in accordance with one or more embodiments of the present disclosure. In embodiments, the overlay metrology system includes an illumination sub-system. In embodiments, the illumination sub-system includes an illumination source configured to generate an illumination beam. In embodiments, the illumination sub-system includes one or more illumination optics configured to direct the illumination beam to an overlay target on a sample as the sample is scanned relative to the illumination beam along a scan direction when implementing a metrology recipe. In embodiments, the overlay target, in accordance with the metrology recipe, includes one or more cells having multi-layer grating structures formed as overlapping grating structures with different pitches on three or more layers of the sample, where the three or more layers of the sample include at least a first layer, a second layer, and a third layer, where the overlapping grating structures are periodic along at least one of the scan direction or a direction orthogonal to the scan direction. In embodiments, the overlay metrology system includes a collection sub-system including a first photodetector located in a pupil plane at a first location to capture overlapping diffraction orders from the multi-layer grating structures in the one or more cells when implementing the metrology recipe and a second photodetector located in the pupil plane at a second location to capture overlapping diffraction orders from the multi-layer grating structures in the one or more cells when implementing the metrology recipe. In embodiments, the overlay metrology system includes a controller communicatively coupled to the first photodetector and the second photodetector. In embodiments, the controller includes one or more processors configured to execute program instructions causing the one or more processors to receive time-varying interference signals from the first photodetector and the second photodetector associated with the multi-layer grating structures in the one or more cells as the overlay target is scanned in accordance with the metrology recipe. In embodiments, the controller includes one or more processors configured to execute program instructions causing the one or more processors to determine an overlay error between one of the first layer, the second layer, or the third layer of the sample based on the time-varying interference signals.

An overlay metrology target is disclosed, in accordance with one or more embodiments of the present disclosure. In embodiments, the overlay metrology target includes a multi-layer grating structure formed as an overlapping grating structure with different pitches on three or more layers of a sample, where the three or more layers of the sample include at least a first layer, a second layer, and a third layer, where the overlapping grating structure is periodic along at least one of the scan direction or a direction orthogonal to the scan direction. In embodiments, the multi-layer grating structure includes a first-layer grating on the first layer with a first pitch, a second-layer grating on the second layer with a second pitch, and a third-layer grating on the third layer with a third pitch.

A method is disclosed, in accordance with one or more embodiments of the present disclosure. In embodiment, the method includes receiving time-varying interference signals from first and second photodetectors associated with a multi-layer grating structure in one or more cells as an overlay target is scanned in accordance with a metrology recipe, where the overlay target in accordance with the metrology recipe includes the one or more cells having the multi-layer grating structure formed as overlapping grating structures with different pitches on three or more layers of a sample, where the three or more layers of the sample include at least a first layer, a second layer, and a third layer, where the overlapping grating structures are periodic along at least one of the scan direction or a direction orthogonal to the scan direction. In embodiments, the method includes determining an overlay error between one of the first layer, the second layer, or the third layer of the sample based on the time-varying interference signals.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
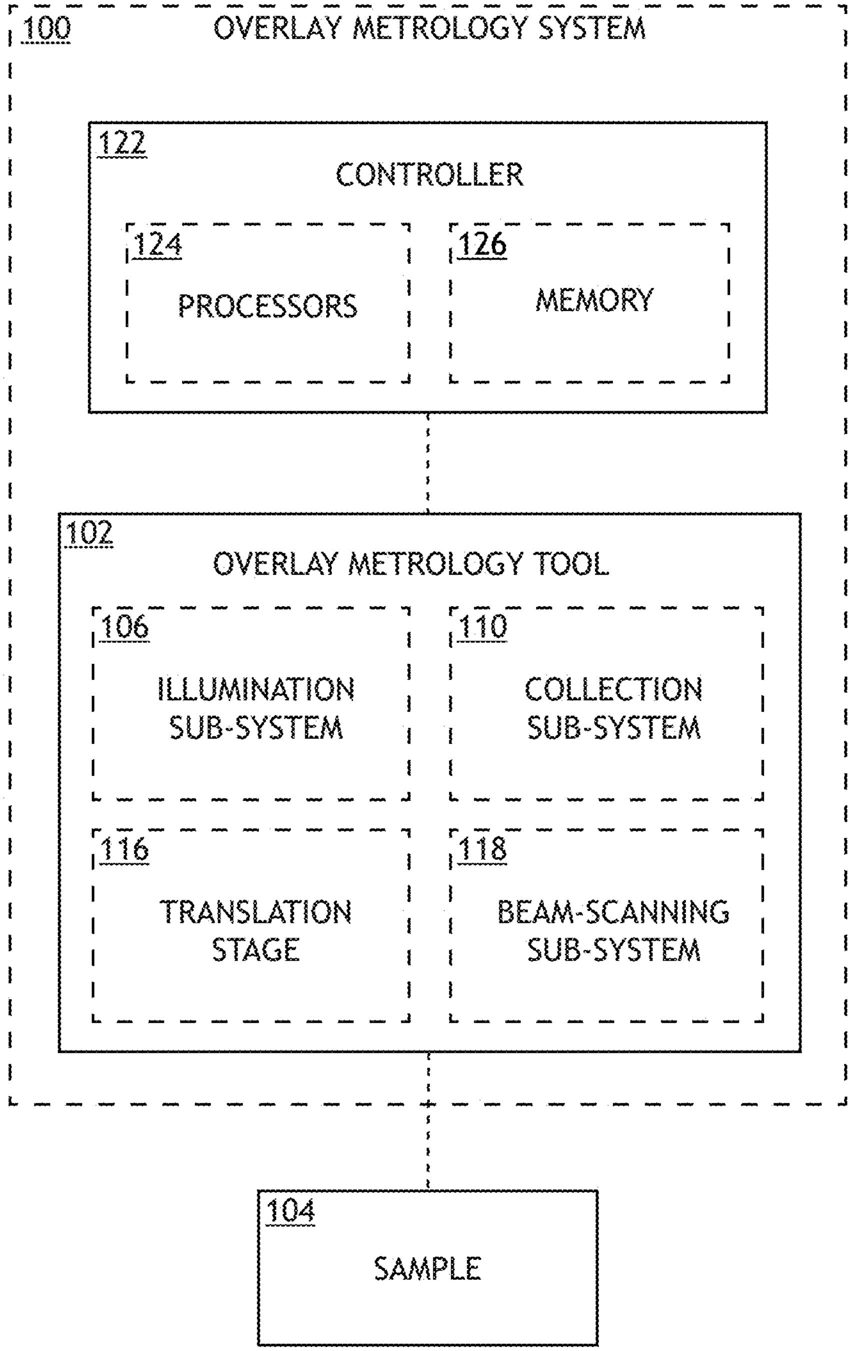
FIG. 1A is a conceptual view of a system for performing scatterometry overlay metrology on overlay targets with at least one multi-layer grating structure, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to scanning scatterometry overlay using overlay targets including multi-layer grating structures. For example, a multi-layer grating structure may include a grating-over-grating structure in which the constituent gratings have different pitches.

For the purposes of the present disclosure, the term "scatterometry metrology" is used to broadly encompass the terms "scatterometry-based metrology" and "diffraction-based metrology" in which a sample having periodic features on one or more sample layers is illuminated with an illumination beam having a limited angular extent and one or more distinct diffraction orders are collected for the measurement. Further, the term "scanning metrology" is used to describe metrology measurements generated when a sample is in motion relative to illumination used for a measurement. In a general sense, scanning metrology may be implemented by moving the sample, the illumination, or both.

Embodiments of the present disclosure are directed to systems and methods for scanning overlay metrology based on time-varying interference signals from multi-layer grating structures in a collection pupil plane. It is contemplated herein that measurement conditions leading to overlapping diffraction orders from the constituent gratings of a multi-layer grating structure may lead to interference. Such interference signals may include information associated with asymmetries in the target structure such as, but not limited to, overlay between the top and bottom gratings, overlay between the top and middle gratings, overlay between the middle and bottom gratings, and the like. It is further contemplated herein that scanning the multi-layer grating structure relative to an illumination beam (or vice versa) may provide characterization of the position-dependent overlay of the multi-layer grating structure and may thus enable the determination of asymmetries such as, but not limited to, overlay.

Some embodiments of the present disclosure are directed to scanning scatterometry overlay metrology based on time-varying interference signals associated with overlapping diffraction lobes from gratings (e.g., top, middle, or bottom gratings) of a multi-layer grating structure or diffraction from the multi-layer grating structure. For instance, scanning-based scatterometry measurement techniques may include fast detectors to capture time-varying interference signals generated as the sample is scanned. The detectors may be placed in the pupil plane at locations of overlap between selected diffraction orders to capture time-varying interference signals as the sample is scanned. Various non-limiting scanning scatterometry overlay metrology techniques are described in U.S. Pat. No. 11,300,405 issued on Apr. 12, 2022; U.S. Pat. No. 11,378,394, issued on Jul. 5, 2022; U.S. patent application Ser. No. 17/708,958, filed on Mar. 30, 2022; U.S. patent application Ser. No. 17/709,200, filed Mar. 30, 2022; U.S. patent application Ser. No. 17/709,104, filed on Mar. 30, 2022; and U.S. patent application Ser. No. 18/110,746, filed on Feb. 16, 2023, which are all incorporated herein by reference in their entireties. It is contemplated herein that the systems and methods of the above incorporated references may be extended or otherwise adapted to provide overlay measurements of multi-layer grating structures.

In some embodiments, an overlay metrology system includes photodetectors located in a pupil plane at positions corresponding to diffraction lobes from multi-layer grating structures. For example, photodetectors may be located at locations of overlap between diffraction lobes and 0-order diffraction (e.g., specular reflection). It is contemplated herein that these combined diffraction orders will exhibit time-varying interference signals (e.g., AC signals) during a scanning measurement, which may be captured using the photodetectors. For example, the properties of the multi-layer grating structures (e.g., pitches of the constituent gratings) and/or the measurement conditions (e.g., illumination wavelength, illumination incidence angle, collection angle, or the like) may be selected to provide that positive and negative diffraction orders associated with combined diffraction by the gratings of the multi-layer grating structure are collected by the system and captured by the photodetectors.

Some embodiments of the present disclosure are directed to providing recipes for configuring an overlay metrology tool. An overlay metrology tool is typically configurable according to a recipe including a set of parameters for controlling various aspects of an overlay measurement such as, but not limited to, the illumination of a sample, the collection of light from the sample, or the position of the sample during a measurement. In this way, the overlay metrology tool may be configured to provide a selected type of measurement for one or more overlay target designs of interest. For example, a metrology recipe may include illumination parameters such as, but not limited to, a number of illumination beams, an illumination wavelength, an illumination pupil distribution (e.g., a distribution of illumination angles and associated intensities of illumination at those angles), a polarization of incident illumination, or a spatial distribution of illumination. By way of another example, a metrology recipe may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, wavelength filters, positions of one or more detectors (e.g., photodetectors) or parameters for controlling the one or more detectors. By way of a further example, a metrology recipe may include various parameters associated with the sample position during a measurement such as, but not limited to, a sample height, a sample orientation, whether a sample is static during a measurement, or whether a sample is in motion during a measurement (along with associated parameters describing the speed, scan pattern, or the like).

In some embodiments, the properties of the multi-layer grating structures (e.g., pitches of the constituent gratings, or the like) and the measurement conditions (e.g., illumination wavelength, illumination incidence angle, collection angle, or the like) are arranged or otherwise selected (e.g., using a metrology recipe) to provide a selected distribution of diffraction and/or combined diffraction orders and to further provide that photodetectors are placed at suitable locations to capture these orders to generate time-varying interference signals of interest.

It is further contemplated herein that the systems and methods disclosed herein may provide sensitive overlay metrology at a high throughput. For example, the non-imaging configuration enables the use of fast photodetectors suitable for fast scan speeds. As a non-limiting example, photodetectors having a bandwidth of 1 GHz may enable scan speeds of approximately 10 centimeters per second on targets having a pitch of 1 micrometer.

The multi-layer grating structures may generally be formed as portions of overlay targets and may generally be located anywhere on the sample. Further, overlay targets may include one or more measurement cells, where each cell includes printed elements in overlapping regions of one or more layers on the sample to form the multi-layer grating structures. An overlay measurement may then be based on any combination of measurements of the various cells of the overlay target. For example, multiple cells of an overlay target may be designed with different intended offsets (e.g., grating structures in the various layers of the sample that are intentionally misaligned with known offset values), which may improve the accuracy and/or sensitivity of the measurement.

It is contemplated herein that scatterometry overlay metrology of multi-layer grating structures as disclosed herein may provide numerous benefits. For example, the system and method disclosed herein may utilize multi-layer overlay targets including stack gratings, which may consume less space on the same compared with target designs having a side-by-side layer design. By way of another example, the system and method disclosed herein may save scribe line space both in cases when multiple overlay measurements are needed on a given layer or on standard layers where target stacking is useful. By way of another example, the metrology overlay targets of the disclosed system may be highly performant due to small pitch compared to previous optical imaging systems based on multi-layer targets. By way of another example, the system and method disclosed herein may overcome difficulties in measuring each layer in its ideal condition since the laser scanning method performance is not strongly dependent on the wavelength of light used.

Referring now to FIGS. 1A-6C, systems and methods for scatterometry overlay metrology using multi-overlay stacked grating metrology targets, are described in greater detail in accordance with one or more embodiments of the present disclosure.

FIG. 1A is a conceptual view of an overlay metrology system 100 for performing scatterometry overlay metrology on a multi-overlay stack grating metrology target, in accordance with one or more embodiments of the present disclosure.

In embodiments, the overlay metrology system 100 includes an overlay metrology tool 102 to perform scatterometry overlay measurements of a sample 104. For example, the overlay metrology tool 102 may perform scatterometry overlay measurements on portions of the sample 104 having multi-layer grating structures.

Figure 1B:
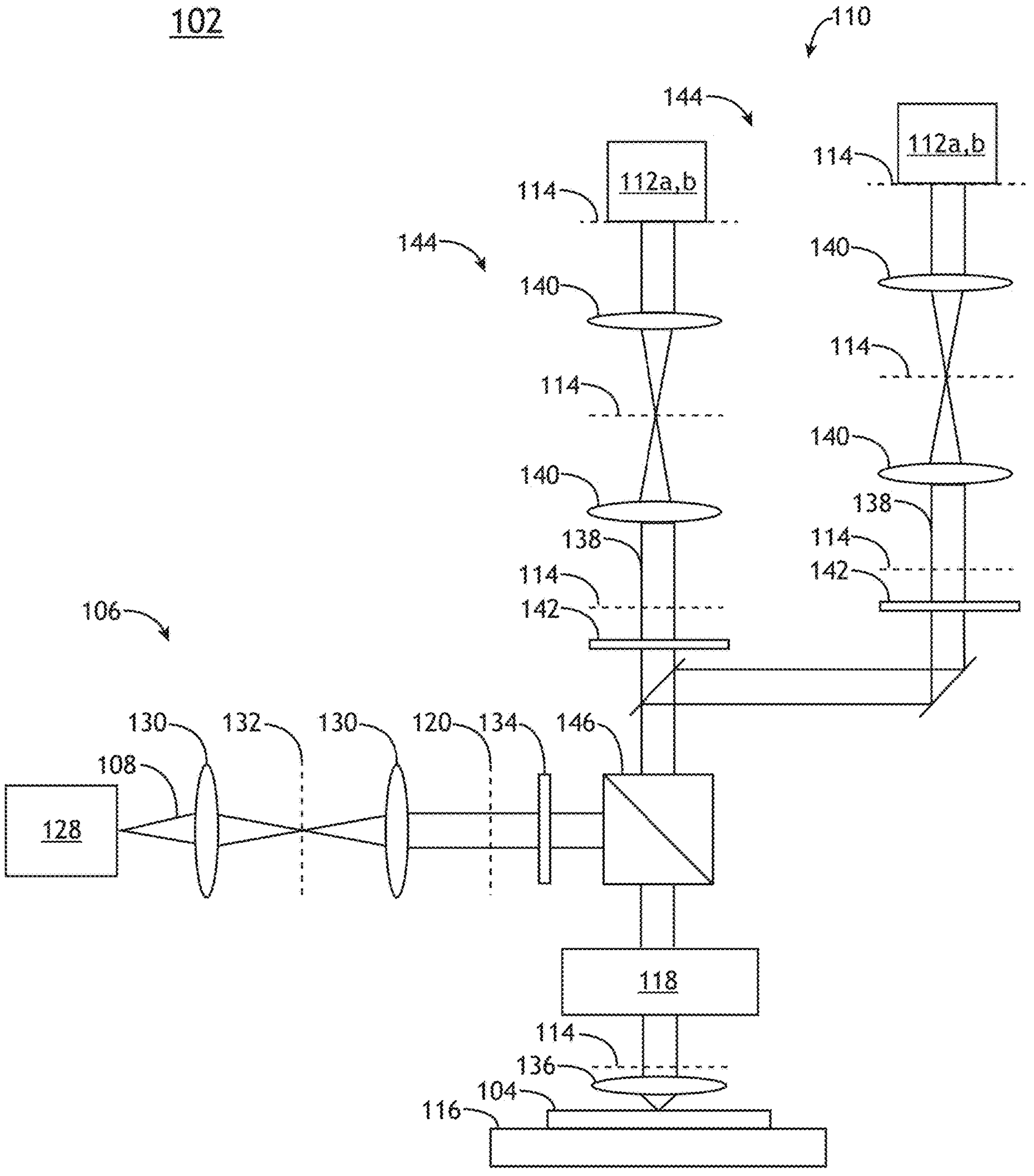
FIG. 1B is a schematic view of the overlay metrology tool, in accordance with one or more embodiments of the present disclosure.

FIG. 1B is a schematic view of the overlay metrology tool 102, in accordance with one or more embodiments of the present disclosure.

In embodiments, the overlay metrology tool 102 includes an illumination sub-system 106 to generate illumination in the form of one or more illumination beams 108 to illuminate the sample 104 and a collection sub-system 110 to collect light from the illuminated sample 104. For example, the one or more illumination beams 108 may be angularly limited on the sample 104 such that multi-layer grating structures (e.g., in one or more cells of an overlay target) may generate discrete diffraction orders. Further, the one or more illumination beams 108 may be spatially limited such that they may illuminate selected portions of the sample 104.

For instance, each of the one or more illumination beams 108 may be spatially limited to illuminate a particular cell of an overlay target. In some embodiments, the one or more illumination beams 108 underfill a particular cell of an overlay target.

The collection sub-system 110 may then collect at least some diffraction orders associated with diffraction of the illumination beam 108 from a multi-layer grating structure. Further, the collection sub-system 110 may include at least two photodetectors 112 positioned in a collection pupil plane 114 at locations associated with time-varying interference signals indicative of overlay. For example, as will be described in greater detail below, suitable locations for the photodetectors 112 may include, but are not limited to, locations associated with positive and negative diffraction orders or locations associated with overlap between diffraction orders of the constituent gratings of a multi-layer grating structure (e.g., an overlap region between +1 diffraction orders of top, middle, and bottom gratings and an overlap region between −1 diffraction orders of the top, middle, and bottom gratings).

In embodiments, the overlay metrology tool 102 includes a translation stage 116 to scan the sample 104 through a measurement field of view of the overlay metrology tool 102 during a measurement to implement scanning metrology.

In embodiments, the overlay metrology tool 102 includes a beam-scanning sub-system 118 configured to modify or otherwise control a position of at least one illumination beam 108 on the sample 104. For example, the beam-scanning sub-system 118 may scan an illumination beam 108 in a direction orthogonal to a scan direction (e.g., a direction in which the translation stage 116 scans the sample 104) during a measurement.

Figure 2:
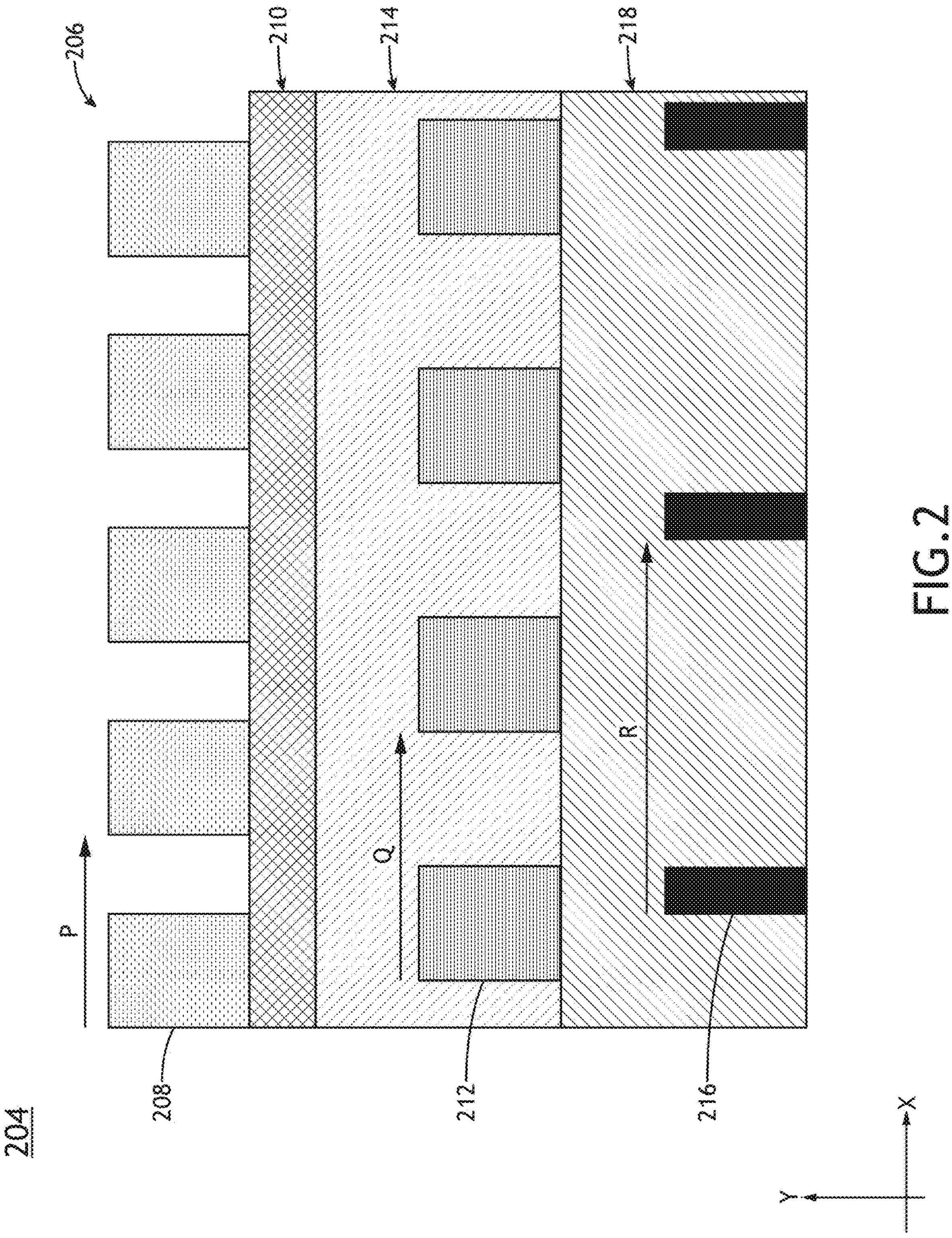
FIG. 2 is a side view of a single cell of an overlay target on a sample, in accordance with one or more embodiments of the present disclosure.
Figure 3A:
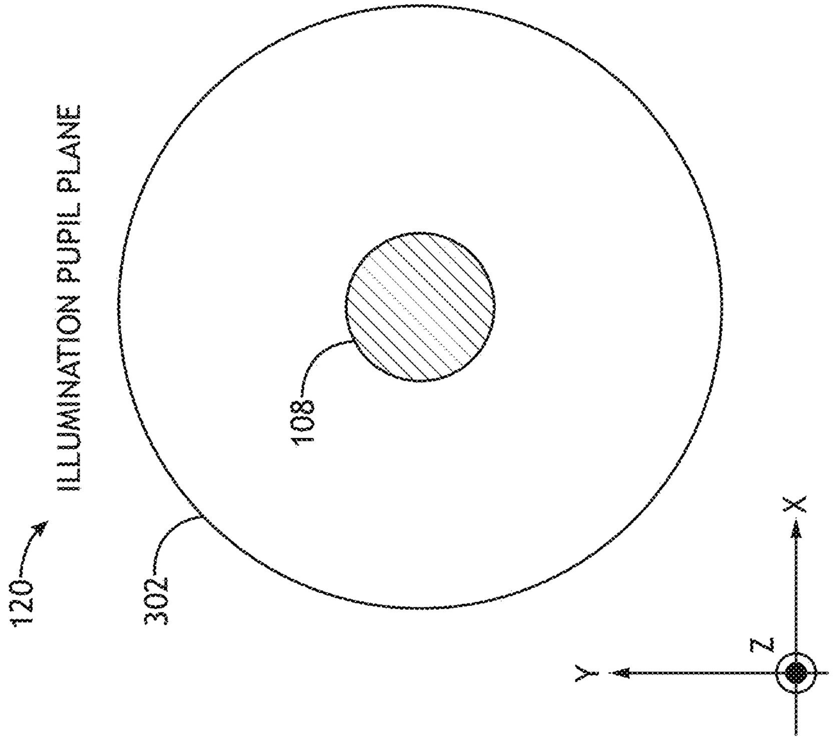
FIG. 3A is a top view of an illumination pupil in an illumination pupil plane of the overlay metrology tool, in accordance with one or more embodiments of the present disclosure.
Figure 3B:
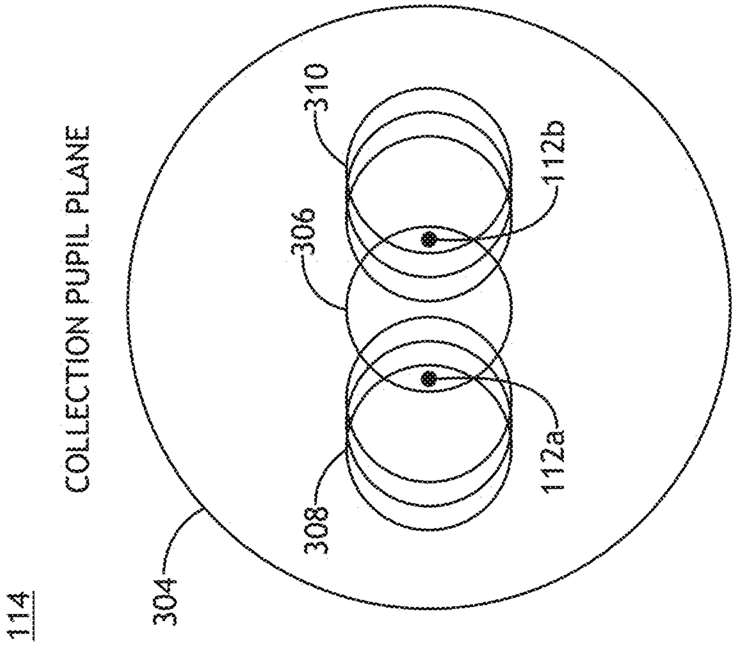
FIG. 3B is a top view of a collection pupil in the collection pupil plane of the overlay metrology tool including grating diffraction lobes associated with the illumination profile in FIG. 3A by a multi-layer grating structure, in accordance with one or more embodiments of the present disclosure.

Referring now to FIGS. 2-3B, the collection of diffraction orders from grating structures and the placement of the photodetectors 112 for scanning scatterometry overlay metrology is described in greater detail in accordance with one or more embodiments of the present disclosure.

FIG. 2 is a side view of a cell 202, in accordance with one or more embodiments of the present disclosure.

In embodiments, the overlay target 204 includes one or more cells 202, where any particular cell 202 of the one or more cells 202 may include a multi-layer grating structure 206 with a periodicity along any direction. For example, an overlay target 204 may include a single cell 202 with a multi-layer grating structure 206 having periodicity along a common direction. By way of another example, the overlay target 204 may include a plurality of cells 202, where the different cells 202 have different configurations of the periodicities of the associated gratings. For instance, the overlay target 204 may include a plurality of cells 202 and each cell includes a multi-layer grating structure 206 having periodicity along a common direction, where the different cells 202 have different configurations of the periodicities of the associated gratings.

In embodiments, the multi-layer grating structure 206 includes three or more layers. For example, the multi-layer grating structure 206 may include a first-layer grating 208 (e.g., a top grating) located on a first layer 210 of the sample 104, a second layer-grating 212 (e.g., a middle grating) located on a second layer 214 of the sample 104, and a third-layer grating 216 (e.g., a bottom grating) located on a third layer 218, where the layers are orientated such that the regions including the first-layer grating 208, the second-layer grating 212, and the third-layer grating 216 overlap to form a grating-over-grating structure.

In embodiments, the multi-layer grating structure 206 is formed of gratings having different pitches. For example, the first-layer grating 208, the second-layer grating 212, and the third-layer grating 216 of the multi-layer grating structure 206 may have different pitches. For instance, FIG. 2 depicts the pitches of the first-layer grating 208, the second-layer grating 212, and the third-layer grating 216 as P, Q, and R, respectively. In another instance, the pitches of the first-layer grating 208, the second-layer grating 212, and the third-layer grating 216 may be Q, P, R, respectively. In another instance, the pitches of the first-layer grating 208, the second-layer grating 212, and the third-layer grating 216 may be R, Q, P, respectively. It is noted that the configuration depicted in FIG. 2 is provided merely for illustrative purposes and shall not be construed as limiting the scope of the present disclosure. As such, the multi-layer grating structure 206 may be formed of any number of layers with any variety of pitches. For example, the multi-layer grating structure 206 may be formed of three or more layers.

It is to be understood, however, that the overlay target 204 in FIG. 2 and the associated description are provided solely for illustrative purposes and should not be interpreted as limiting. Rather, the overlay target 204 may include any suitable multi-layer grating overlay target design. For example, the overlay target 204 may include any number of cells 202 suitable for measurement. Further, the cells 202 may be distributed in any pattern or arrangement. In embodiments, the overlay target 204 includes one or more cell groupings distributed along a scanning direction (e.g., a direction of motion of the sample 104), where cells 202 within each particular cell grouping are oriented to have multi-layer grating structures 206 periodically along a common direction. For instance, a first cell grouping may include one or more cells 202 having periodicities along the X direction, a second cell grouping may include one or more cells 202 having periodicities along the X direction, and a third cell grouping may include one or more cells 202 having periodicities along the X direction. In this way, all cells 202 within a particular cell grouping may be imaged at the same time while the sample 104 is scanned through a measurement field of view of the collection sub-system 110.

Referring now to FIGS. 3A-3B, various non-limiting configurations for the generation and measurement of time-varying interference signals from a multi-layer grating structure 206 in a cell 202 of an overlay target 204 are described in accordance with one or more embodiments of the present disclosure.

FIG. 3A is a top view of an illumination pupil 302 in an illumination pupil plane 120 of the overlay metrology tool 102, in accordance with one or more embodiments of the present disclosure. For example, the illumination pupil plane 120 may correspond to a pupil plane in the illumination sub-system 106 as illustrated in FIG. 1B. In embodiments, the illumination sub-system 106 illuminates the overlay target 204 with one or more illumination beams 108 at normal incidence (or near-normal incidence) as illustrated in FIG. 3A. Further, the one or more illumination beams 108 may illuminate the overlay target 204 with a limited range of incidence angles as illustrated by the limited size in the collection pupil plane 114. In this regard, the overlay target 204 may diffract the one or more illumination beams 108 into discrete diffraction orders.

FIG. 3B illustrates a non-limiting configuration for capturing time-varying interference signals from an overlay target 204 with a multi-layer grating structure 206 in a scanning configuration. In particular, FIG. 3B illustrates a non-limiting configuration of diffraction orders of the illumination beam 108 illustrated in FIG. 3A in a collection pupil plane 114 and associated positions of photodetectors 112 suitable for capturing time-varying interference signals from which an overlay measurement may be extracted. It is contemplated herein that photodetectors 112 placed at locations in the collection pupil plane 114 associated with overlapping diffraction lobes (e.g., areas at which first-order diffraction lobes from a first-layer grating 208, a second-layer grating 212, and a third-layer grating 216 of a multi-layer grating structure 206 may overlap) may capture time-varying interference signals indicative of overlay. It is further contemplated herein that time-varying interference signals associated with combined diffraction lobes may be captured by a photodetector 112 when each of the relevant diffraction lobes are incident on the photodetector 112 (e.g., are within a measurement area of the photodetector 112). In this way, the relevant diffraction lobes need not necessarily overlap in the collection pupil plane 114 but rather may overlap on the photodetector 112.

It is recognized herein that the distribution of diffracted orders of an illumination beam 108 by a periodic structure such as a multi-layer grating structure 206 may be influenced by a variety of parameters such as, but not limited to, a wavelength of the illumination beam 108, an incidence angle of the illumination beam 108 in both altitude and azimuth directions, pitches of the gratings of the multi-layer grating structure 206, or a numerical aperture (NA) of a collection lens. Accordingly, in embodiments of the present disclosure, the illumination sub-system 106, the collection sub-system 110, and the overlay target 204 may be configured (e.g., according to a metrology recipe defining a selected set of associated parameters) to provide a desired distribution of diffraction orders in a collection pupil plane 114 suitable for generating time-varying interference patterns indicative of overlay. For example, the illumination sub-system 106 and/or the collection sub-system 110 may be configured to generate measurements on grating structures having selected range periodicities to provide a desired distribution in the collection pupil plane 114. Further, various components of the illumination sub-system 106 and/or the collection sub-system 110 (e.g., stops, pupils, or the like) may be adjustable to provide the desired distribution in the collection pupil plane 114.

Further, the sizes and shapes of diffraction orders in the collection pupil plane 114 may generally be related to the size and shape of an illumination beam 108 on the sample 104. For example, in the case that the illumination beam 108 is elongated, the associated diffraction orders may similarly be elongated (e.g., in orthogonal directions).

FIG. 3B is a top view of a collection pupil 304 in the collection pupil plane 114 of the overlay metrology tool 102 including grating diffraction lobes associated with the illumination profile in FIG. 3A by a multi-layer grating structure 206, in accordance with one or more embodiments of the present disclosure. For example, the collection pupil plane 114 may correspond to a pupil plane in the collection sub-system 110 as illustrated in FIG. 1B. In particular, FIG. 3B illustrates 0-order diffraction 306, −1 order grating diffraction 308, and +1 order grating diffraction 310 distributed along the direction of periodicity of the multi-layer grating structure 206 (e.g., the X direction here) in the collection pupil plane 114. For example, the −1 order grating diffraction 308 and the +1 order grating diffraction 310 may be associated with grating diffraction from first-layer grating 208, the second-layer grating 212, and the third-layer grating 216, where the diffraction angles are based on a pitches of each of the three gratings and illumination wavelength. In this regard, the respective diffraction lobes of the +1 order grating diffraction 308 from the respective layers 208, 212, 216 may overlap and the −1 order grating diffraction 310 from the respective layers 208, 212, 216 may overlap.

It is contemplated herein that the phase of each of the grating diffraction orders (e.g., the −1 order grating diffraction 308 and the +1 order grating diffraction 310) may oscillate during a scan to form time-varying interference signals and overlay may be determined based on asymmetries of these oscillations. As a result, an overlay measurement may be performed by capturing and comparing these time-varying interference patterns. For example, the phase differences of the −1 order and +1 order grating diffraction 308, 310 from each individual grating may be used to measure the position of the grating relative to the optical system.

In embodiments, the overlay metrology tool 102 includes photodetectors 112 located at positions suitable for capturing overlapping 0-order diffraction and grating diffraction. For example, FIG. 3B illustrates a configuration in which the grating diffraction lobes overlap with 0-order diffraction in the collection pupil plane 114 (e.g., as provided by a metrology recipe). For instance, as shown in FIG. 3B, the grating diffraction lobes from the +1 order diffraction 308 and the −1 order diffraction 310 may overlap with diffraction lobe of the 0-order diffraction 306. FIG. 3B further illustrates a first photodetector 112*a* located at a region of overlap between the −1 order diffraction 308 and a second photodetector 112*b* located at a region of overlap between the +1 order diffraction 310. Each of the photodetectors 112 may then capture a time-varying interference signal as the sample 104 is scanned, where differences between the time-varying interference signals captured by the photodetectors 112 are indicative of overlay.

It is to be understood, however, that the particular configuration illustrated in FIG. 3B and the associated description is not limiting. For example, as described previously herein, the 0-order diffraction 306 need not necessarily overlap with the −1 order grating diffraction 308 and the +1 order grating diffraction 310 in the collection pupil 304 as illustrated in FIG. 3B. Rather, in some embodiments, these diffraction lobes are sufficiently close together that the 0-order diffraction 306 overlaps with the −1 order grating diffraction 308 on a first photodetector 112*a* and the 0-order diffraction 306 overlaps with the +1 order grating diffraction 310 on a second photodetector 112*b*. Additionally, in some embodiments, an overlay measurement is determined based on time-varying signals associated with only the first-order grating diffraction lobes (e.g., without reference to 0-order diffraction 306). For example, an overlay measurement may be determined based on time-varying signals associated with overlap between auxiliary illumination and +/−1 order diffraction lobes, as generally discussed in U.S. patent application Ser. No. 18/110,746, filed on Feb. 16, 2023, which is incorporated herein by reference in the entirety.

Referring now generally to FIGS. 3A-3B, it is to be understood that FIGS. 3A-3B are provided solely for illustrative purposes and should not be interpreted as limiting. For example, FIGS. 3A-3B illustrate a non-limiting case of diffraction of an illumination beam 108 incident on the sample at normal incidence. However, it is contemplated herein that the illumination beam 108 may generally have any profile suitable for allowing collection of combined or overlapping diffraction orders as disclosed herein (e.g., grating diffraction orders associated with combined diffraction from overlapping gratings of a grating structure 206, overlapping grating diffraction and 0-order diffraction, overlapping first-order diffraction from the constituent gratings of a grating structure 206, or the like). In some embodiments, the illumination beam 108 has an annular profile. It is contemplated herein that an annular profile of an illumination beam 108 may facilitate separation of overlapping diffraction orders in the collection pupil plane 114. The use of annular apertures to separate overlapping diffraction orders is generally described in U.S. Pat. No. 10,197,389, issued on Feb. 9, 2019, which is incorporated herein by reference in its entirety. It is noted that although U.S. Pat. No. 10,197,389 includes descriptions of static metrology, the use of an annular illumination beam 108 may be similarly utilized in scanning metrology as disclosed herein. In particular, in some embodiments, photodetectors 112 are placed at locations of overlapping diffraction orders (e.g., overlapping grating diffraction and 0-order diffraction, overlapping first-order diffraction from the constituent gratings of a multi-layer grating structure 206, or the like) generated based on an annular illumination beam 108.

Figure 4A:
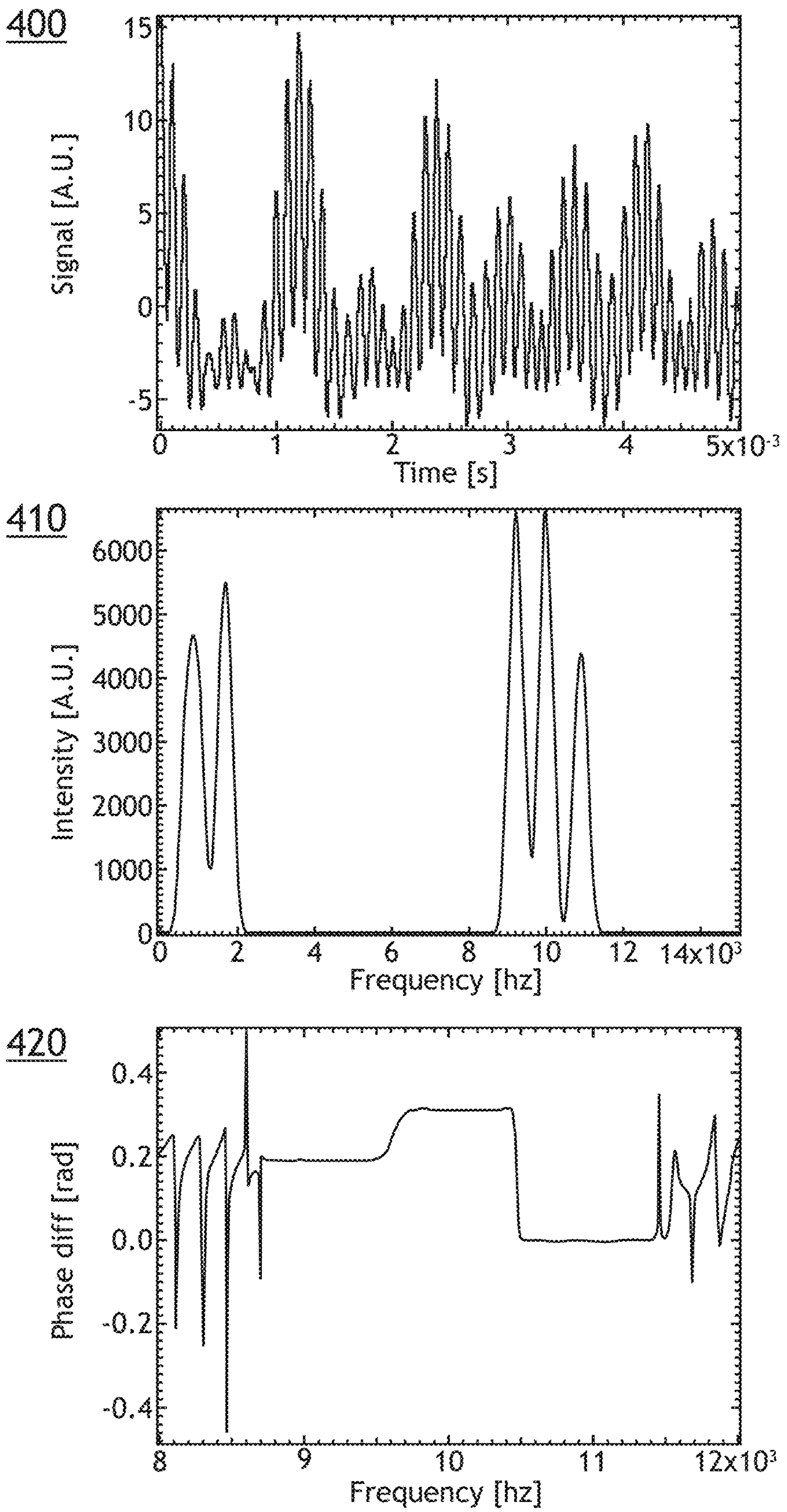
FIG. 4A is a Fast Fourier Transform plot, in accordance with one or more embodiments of the present disclosure.
Figure 4B:
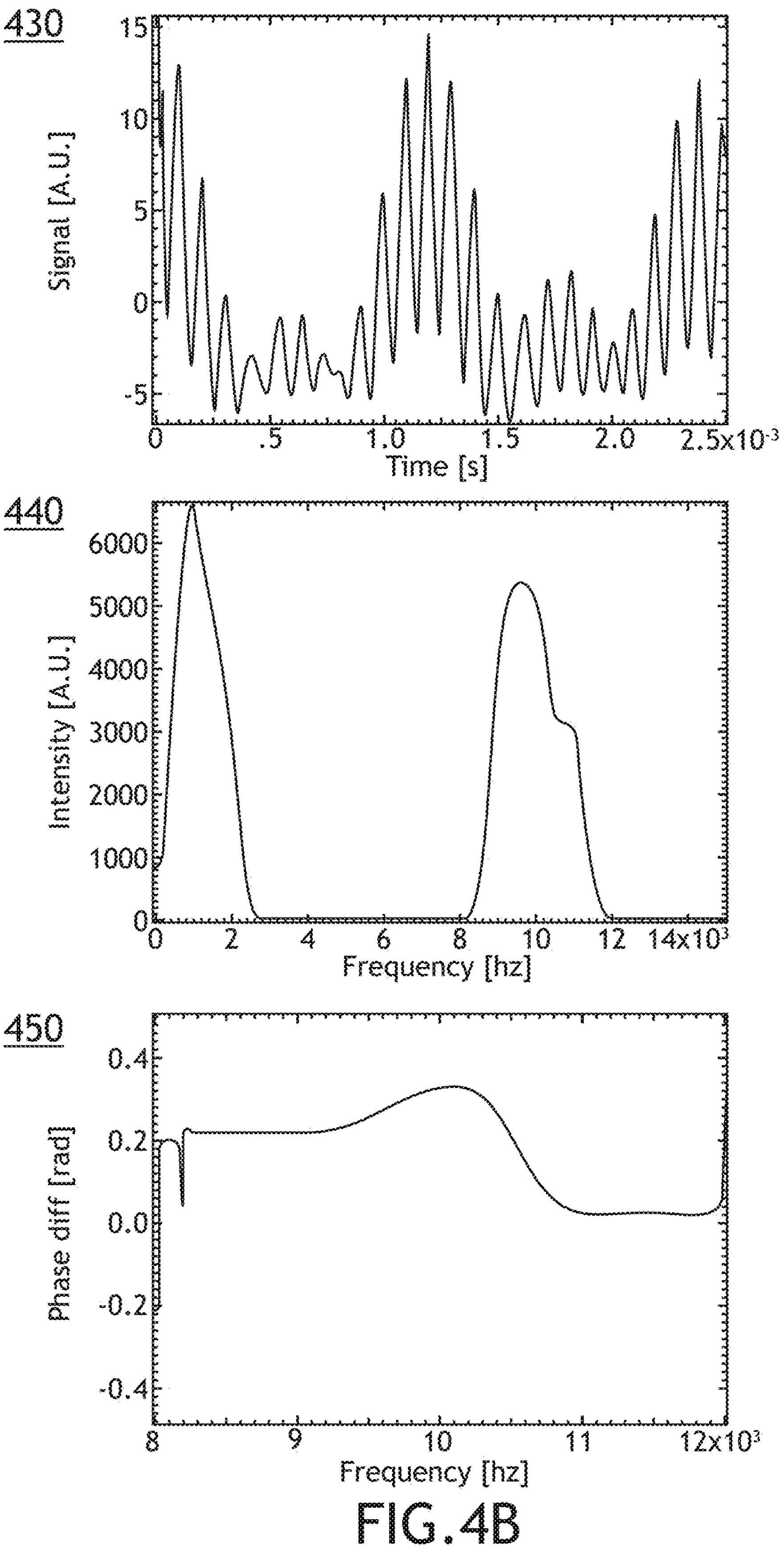
FIG. 4B is a Fast Fourier Transform plot, in accordance with one or more embodiments of the present disclosure.

FIGS. 4A-4B depict Fast Fourier Transform plots 400-450, in accordance with one or more embodiments.

In embodiments, the overlay measurement between the layers 210-218 of the overlay target 204 may be determined based on a comparison of the interference signals detected by the photodetectors. For example, the controller 122 may be configured to determine overlay measurements based on the magnitudes (plots 410, 440) and/or phases (plots 420, 450) of the interference signals, as shown in FIGS. 4A-4B.

In embodiments, the per-grating phase differences may be measured using a Fast Fourier transform (FFT) algorithm used to transform the signal from the raw data (shown in plots 400, 430) into the frequency domain (as shown in plots 410, 420, 440, 450). In this regard, as depicted in plot 420, the phase differences at the frequency domain may correspond to the grating pitch. It is noted that as each grating modulates, the temporal signal may be proportional to its spatial frequency (e.g., inverse pitch 1/P, 1/Q or 1/R).

It is noted that the parameters of the metrology recipe may be selected based on the specific parameter to be resolved. The parameters need to be sufficient to resolve the particular pitches. For example, the pitches, cell length, or number features may be selected such that the particular pitches in the plots are resolvable.

In a non-limiting example, the cell length may be selected such that the particular pitches in the plots are resolvable. For example, as shown in FIG. 4A, the phase differences of the −1 order and +1 order grating diffraction 308, 310 from each individual grating in plot 420 is distinguishable for a cell having a length of approximately 15 μm. In comparison, as shown in FIG. 4B, the phase differences of the −1 order and +1 order grating diffraction 308, 310 from each individual grating in plot 450 is not clearly distinguishable for a cell having a length of approximately 7.5 μm.

Referring again to FIG. 1A, additional components of the overlay metrology tool 102 are described in greater detail in accordance with one or more embodiments of the present disclosure.

The photodetectors 112 may generally include any type of optical detector known in the art suitable for capturing interference signals generated as the sample 104 is translated by the translation stage 116 and/or as one or more illumination beams 108 are scanned by the beam-scanning subsystem 118. For example, the photodetectors 112 may include, but are not limited to, fast photodiodes, photomultipliers, or avalanche photodiodes.

In a general sense, the bandwidth or response time of the photodetectors 112 should be sufficient to resolve the temporal frequency of the interference fringes, which is related to the pitch of the top, middle, and bottom gratings of a multi-layer grating structure 206 and the scanning speed along a measurement direction (the direction of periodicity of the multi-layer grating structure 206). For example, in the case of a scan speed along a measurement direction of 10 centimeters per second and a target pitch of 1 micrometer, the interference signals will oscillate at a rate on the order of 100 kHz. In some embodiments, the photodetectors 112 include photodetectors having a bandwidth of at least 1 GHz. However, it is to be understood that this value is not a requirement. Rather, the bandwidth of the photodetectors 112, the translation speed along the measurement direction, and the pitch of the multi-layer grating structures may be selected together to provide a desired sampling rate of the interference signal.

In embodiments, the overlay metrology system 100 includes a controller 122 communicatively coupled to the overlay metrology tool 102. The controller 122 may include one or more processors 124 and a memory device 126, or memory. For example, the one or more processors 124 may be configured to execute a set of program instructions maintained in the memory device 126.

The one or more processors 124 of the controller 122 may generally include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FPGAs), or one or more digital signal processors (DSPs)). In this sense, the one or more processors 124 may include any device configured to execute algorithms and/or instructions (e.g., program instructions stored in memory). In some embodiments, the one or more processors 124 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure. Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 122 may include one or more controllers housed in a common housing or within multiple housings. In this way, any controller or combination of controllers may be separately packaged as a module suitable for integration into metrology overlay metrology system 100. Further, the controller 122 may analyze or otherwise process data received from the photodetectors 112 and feed the data to additional components within the overlay metrology system 100 or external to the overlay metrology system 100.

Further, the memory device 126 may include any storage medium known in the art suitable for storing program instructions executable by the associated one or more processors 124. For example, the memory device 126 may include a non-transitory memory medium. As an additional example, the memory device 126 may include, but is not limited to, a read-only memory, a random-access memory, a magnetic or optical memory device (e.g., disk), a magnetic tape, a solid-state drive and the like. It is further noted that memory device 126 may be housed in a common controller housing with the one or more processors 124.

In this regard, the controller 122 may execute any of various processing steps associated with overlay metrology. For example, the controller 122 may be configured to generate control signals to direct or otherwise control the overlay metrology tool 102, or any components thereof. For instance, the controller 122 may be configured to direct the translation stage 116 to translate the sample 104 along one or more measurement paths, or swaths, to scan one or more overlay targets through a measurement field of view of the overlay metrology tool 102 and/or direct the beam-scanning sub-system 118 to position or scan one or more illumination beams 108 on the sample 104. By way of another example, the controller 122 may be configured to receive signals corresponding to the time-varying interference signals from the photodetectors 112. By way of another example, the controller 122 may generate correctables for one or more additional fabrication tools as feedback and/or feed-forward control of the one or more additional fabrication tools based on overlay measurements from the overlay metrology tool 102.

In embodiments, the controller 122 captures the interference signals detected by the photodetectors 112. The controller 122 may generally capture data such as, but not limited to, the magnitudes or the phases of the time-varying interference signals using any technique known in the art such as, but not limited to, frequency-domain analysis (e.g., FFT), one or more phase-locked loops, and the like. Further, the controller 122 may capture the interference signals, or any data associated with the interference signals, using any combination of hardware (e.g., circuitry) or software techniques.

In embodiments, the controller 122 determines an overlay measurement between layers of the overlay target 204 (e.g., the first layer 210, the second layer 214, and the third layer 218) along the measurement direction based on the comparison of the interference signals. For example, the controller 122 may determine an overlay measurement based on the magnitudes and/or phases of the interference signals, as shown in FIG. 4. For instance, U.S. Pat. No. 10,824,079, issued on Nov. 3, 2020, which is incorporated herein by reference in its entirety, generally describes the electric field of diffracted orders in a collection pupil and further provides specific relationships between overlay and measured intensity in the pupil plane. It is contemplated herein that the systems and methods disclosed herein may extend the teachings of U.S. Pat. No. 10,824,079 to time-varying interference signals captured by photodetectors placed in overlap regions between 0 and +/−1 diffraction orders). In particular, it is contemplated herein that overlay on a sample may be proportional to asymmetries such as, but not limited to, a relative phase shift between the two time-varying interference signals.

Further, the controller 122 may calibrate or otherwise modify the overlay measurement based on known, assumed, or measured features of the sample that may also impact the time-varying interference signals such as, but not limited to, sidewall angles or other sample asymmetries.

Referring again to FIG. 1B, various components of the overlay metrology tool 102 are described in greater detail in accordance with one or more embodiments of the present disclosure.

In embodiments, the illumination sub-system 106 includes an illumination source 128 configured to generate at least one illumination beam 108. The illumination from the illumination source 128 may include one or more selected wavelengths of light including, but not limited to, ultraviolet (UV) radiation, visible radiation, or infrared (IR) radiation.

The illumination source 128 may include any type of illumination source suitable for providing at least one illumination beam 108. In some embodiments, the illumination source 128 is a laser source. For example, the illumination source 128 may include, but is not limited to, one or more narrowband laser sources, a broadband laser source, a supercontinuum laser source, a white light laser source, or the like. In this regard, the illumination source 128 may provide an illumination beam 108 having high coherence (e.g., high spatial coherence and/or temporal coherence). In some embodiments, the illumination source 128 includes a laser-sustained plasma (LSP) source. For example, the illumination source 128 may include, but is not limited to, an LSP lamp, an LSP bulb, or an LSP chamber suitable for containing one or more elements that, when excited by a laser source into a plasma state, may emit broadband illumination.

In embodiments, the illumination sub-system 106 includes one or more optical components suitable for modifying and/or conditioning the illumination beam 108 as well as directing the illumination beam 108 to the sample 104. For example, the illumination sub-system 106 may include one or more illumination lenses 130 (e.g., to collimate the illumination beam 108, to relay an illumination pupil plane 120 and/or an illumination field plane 132, or the like). In some embodiments, the illumination sub-system 106 includes one or more illumination control optics 134 to shape or otherwise control the illumination beam 108. For example, the illumination control optics 134 may include, but are not limited to, one or more field stops, one or more pupil stops, one or more polarizers, one or more filters, one or more beamsplitters, one or more diffusers, one or more homogenizers, one or more apodizers, one or more beam shapers, or one or more mirrors (e.g., static mirrors, translatable mirrors, scanning mirrors, or the like).

In embodiments, the overlay metrology tool 102 includes an objective lens 136 to focus the illumination beam 108 onto the sample 104 (e.g., an overlay target with overlay target elements located on two or more layers of the sample 104).

In embodiments, the illumination sub-system 106 illuminates the sample 104 with two or more illumination beams 108. Further, the two or more illumination beams 108 may be, but are not required to be, incident on different portions of the sample 104 (e.g., different cells of an overlay target) within a measurement field of view (e.g., a field of view of the objective lens 136). It is contemplated herein that the two or more illumination beams 108 may be generated using a variety of techniques. In some embodiments, the illumination sub-system 106 includes two or more apertures at an illumination field plane 132. In some embodiments, the illumination sub-system 106 includes one or more beamsplitters to split illumination from the illumination source 128 into the two or more illumination beams 108. In some embodiments, at least one illumination source 128 generates two or more illumination beams 108 directly. In a general sense, each illumination beam 108 may be considered to be a part of a different illumination channel regardless of the technique in which the various illumination beams 108 are generated.

In embodiments, the collection sub-system 110 includes at least two photodetectors 112 (e.g., photodetectors 112*a,b*) located at a collection pupil plane 114 configured to capture light from the sample 104 (e.g., collected light 138), where the collected light 138 includes at least the 0-order diffraction 306, the −1 order diffraction 308, and the +1 order diffraction 310 as illustrated in FIG. 3B. The collection sub-system 110 may include one or more optical elements suitable for modifying and/or conditioning the collected light 138 from the sample 104. In some embodiments, the collection sub-system 110 includes one or more collection lenses 140 (e.g., to collimate the illumination beam 108, to relay pupil and/or field planes, or the like), which may include, but are not required to include, the objective lens 136. In some embodiments, the collection sub-system 110 includes one or more collection control optics 142 to shape or otherwise control the collected light 138. For example, the collection control optics 142 may include, but are not limited to, one or more field stops, one or more pupil stops, one or more polarizers, one or more filters, one or more beamsplitters, one or more diffusers, one or more homogenizers, one or more apodizers, one or more beam shapers, or one or more mirrors (e.g., static mirrors, translatable mirrors, scanning mirrors, or the like).

In embodiments, the collection sub-system 110 includes two or more collection channels 144, each with a separate pair of photodetectors 112. For example, as illustrated in FIG. 1B, the overlay metrology tool 102 may include one or more beamsplitters 146 arranged to split the collected light 138 into the collection channels 144. Further, the beamsplitters 146 may be polarizing beamsplitters, non-polarizing beamsplitters, or a combination thereof. It is to be understood, however, that the illustration of two collection channels 144 in FIG. 1B is provided solely for illustrative purposes and should not be interpreted as limiting. For example, the collection sub-system 110 may include a single collection channel 144 or multiple collection channels 144.

In embodiments, multiple collection channels 144 are configured to collect light from multiple illumination beams 108 on the sample 104. For example, in the case that an overlay target 204 has one or more cells 202 distributed in a direction different than a scan direction, the overlay metrology tool 102 may simultaneously illuminate the different cells 202 with different illumination beams 108 and simultaneously capture interference signals associated with each illumination beam 108. Additionally, in some embodiments, multiple illumination beams 108 directed to the sample 104 may have different polarizations. In this way, the diffraction orders associated with each of the illumination beams 108 may be separated. For example, polarizing beamsplitters 146 may efficiently separate the diffraction orders associated with the different illumination beams 108. By way of another example, polarizers may be used in one or more collection channels 144 to isolate desired diffraction orders for measurement.

In embodiments, the overlay metrology tool 102 includes a beam-scanning sub-system 118 to position, scan, or modulate positions of one or more illumination beams 108 on the sample 104 during measurement.

The beam-scanning sub-system 118 may include any type or combination of elements suitable for scanning positions of one or more illumination beams 108. In some embodiments, the beam-scanning sub-system 118 includes one or more deflectors suitable for modifying a direction of an illumination beam 108. For example, a deflector may include, but is not limited to, a rotatable mirror (e.g., a mirror with adjustable tip and/or tilt). Further, the rotatable mirror may be actuated using any technique known in the art. For example, the deflector may include, but is not limited to, a galvanometer, a piezo-electric mirror, or a micro-electro-mechanical system (MEMS) device. By way of another example, the beam-scanning sub-system 118 may include an electro-optic modulator, an acousto-optic modulator, or the like.

The deflectors may further be positioned at any suitable location in the overlay metrology tool 102. In some embodiments, one or more deflectors are placed at one or more pupil planes common to both the illumination sub-system 106 and the collection sub-system 110. In this regard, the beam-scanning sub-system 118 may be a pupil-plane beam scanner and the associated deflectors may modify the positions of one or more illumination beams 108 on the sample 104 without impacting positions of diffraction orders in the collection pupil plane 114. Further, a distribution of one or more illumination beams 108 in an illumination field plane 132 may further be stable as the beam-scanning sub-system 118 modifies positions of the one or more illumination beams 108 on the sample 104. Pupil-plane beam scanning is described generally in U.S. patent application Ser. No. 17/142,783 filed on Jan. 6, 2021, which is incorporated by reference in its entirety.

Figure 5:
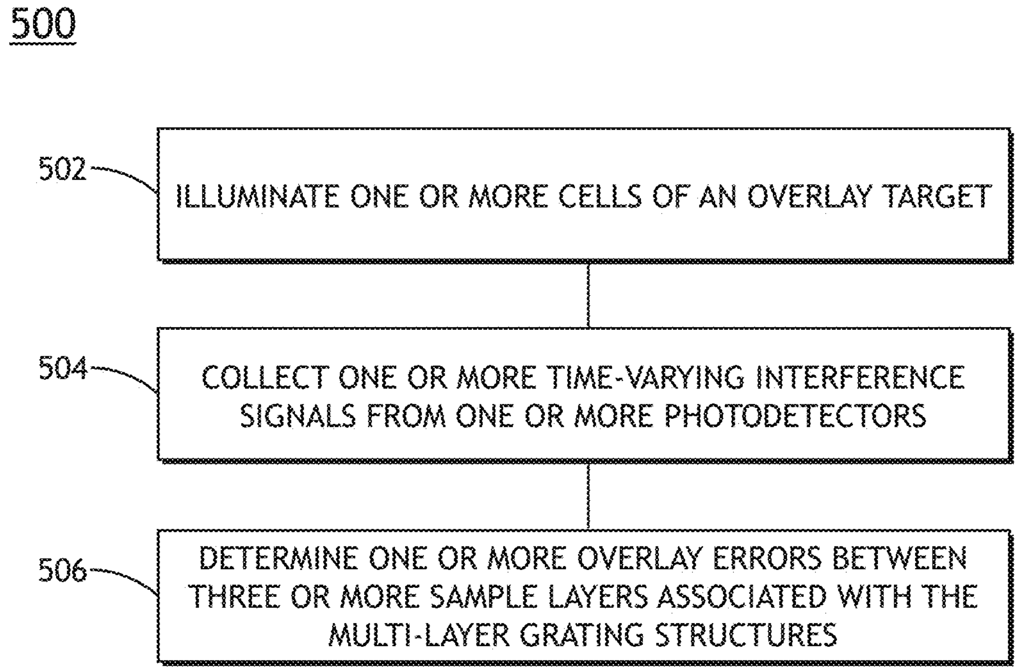
FIG. 5 is a flow diagram illustrating steps performed in a method for scanning overlay metrology of overlay targets with a multi-layer grating structure, in accordance with one or more embodiments of the present disclosure.

FIG. 5 is a flow diagram illustrating steps performed in a method 500 for scanning overlay metrology of overlay targets with at least one multi-layer grating structure, in accordance with one or more embodiments of the present disclosure. Applicant notes that the embodiments and enabling technologies described previously herein in the context of the overlay metrology system 100 should be interpreted to extend to the method 500. It is further noted, however, that the method 500 is not limited to the architecture of the overlay metrology system 100.

In a step 502, one or more cells of an overlay target are illuminated. For example, the one or more cells 202 of the overlay target 204 on the sample 104 are illuminated as the sample 104 is scanned with respect to the illumination, wherein the one or more cells include the multi-layer grating structures 206 formed from overlapping gratings with different pitches.

In a step 504, time-varying interference signals from one or more photodetectors 112*a,b* may be collected. For example, the time-varying interference signals from the two photodetectors 112*a,b* placed in regions of the collection pupil associated with overlapping diffraction from the gratings in the multi-layer grating structures 206. For instance, non-limiting configurations may include, but are not limited to, photodetectors may be placed at locations including exclusively grating diffraction orders, both grating diffraction orders and 0-order diffraction, or first-order diffraction from top, middle, and bottom gratings of a multi-layer grating structure 206.

In a step 506, an overlay error between the one or more sample layers associated with the multi-layer grating structures may be determined. For example, the overlay error between sample layers associated with the multi-layer grating structures in the one or more cells 202 of the overlay target 204 are determined based on the signals from the two photodetectors 112*a,b*. For instance, an overlay error along a direction of periodicity of the multi-layer grating structures 206 may be proportional to a phase difference between the time-varying interference signals from the two photodetectors. The phase difference may be determined using any technique known in the art including, but not limited to, frequency-domain analysis techniques (e.g., Fast Fourier Transform, or the like) applied to the two time-varying interference signals. Further, in some embodiments, overlay measurements of the sample along a particular measurement direction may be generated based on data from multiple cells of the overlay target with multi-layer grating structures having periodicity along the particular measurement direction.

In embodiments, the overlay error between the one or more sample layers associated with the multi-layer grating structures 206 may be determined based on Equations 1.1-1.3, as shown and described by:

$$OVL_{P-Q} = X_P - X_Q \tag{1.1}$$

$$OVL_{P-R} = X_P - X_R \tag{1.2}$$

$$OVL_{Q-R} = X_Q - X_R \tag{1.3}$$

where the position X of the gratings with pitch P, Q, R are derived from the +/−first order phases $\phi_i$ shown and described by Equations 2.1-2.3 below:

$$X_P = \frac{1}{4\pi}(P(\phi_{P,1} + \phi_{P,-1})) \tag{2.1}$$

$$X_Q = \frac{1}{4\pi}(Q(\phi_{Q,1} + \phi_{Q,-1})) \tag{2.2}$$

$$X_R = \frac{1}{4\pi}(R(\phi_{R,1} + \phi_{R,-1})) \tag{2.3}$$

It is contemplated herein that the method 500 may be applied to a wide variety of overlay target designs suitable for 1D or 2D metrology measurements.

In some embodiments, an overlay measurement is generated based on signals from an overlay target with a single cell using the method 500.

In some embodiments, an overlay measurement is generated based on signals from an overlay target with multiple cells having different variations of a multi-layer grating structure. For example, in an optional step 508, tool induced shift (TIS) errors may be reduced or eliminated by averaging measurements. For instance, the TIS error of the overlay target 204 may be determined based on a difference between the overlay error one or more of the plurality of cells 202.

Figures 6A, 6B, 6C:
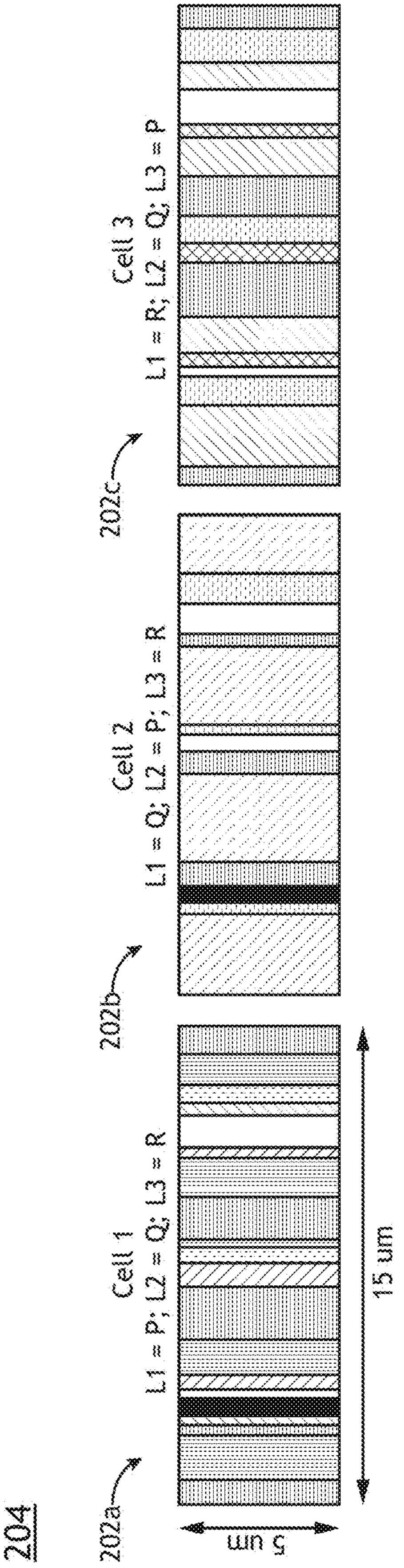
FIG. 6A is a top view of a cell of an overlay target with a multi-layer grating structure, in accordance with one or more embodiments of the present disclosure.
FIG. 6B is a top view of a cell of an overlay target with a multi-layer grating structure, in accordance with one or more embodiments of the present disclosure.
FIG. 6C is a top view of a cell of an overlay target with a multi-layer grating structure, in accordance with one or more embodiments of the present disclosure.

FIGS. 6A-6C are top views of a plurality of cells 202 of an overlay target 204 with a multi-layer grating structure 206, in accordance with one or more embodiments of the present disclosure.

In embodiments, the overlay target 204 includes a plurality of cells 202. For example, the overlay target 204 may include a first cell 202*a*, a second cell 202*b*, and a third cell 202*c*.

The first cell 202*a* may include a first-layer grating (e.g., a top grating) located on a first layer of the sample 104, a second layer-grating (e.g., a middle grating) located on a second layer of the sample 104, and a third-layer grating (e.g., a bottom grating) located on a third layer, where the gratings have different pitches. For example, the pitches of the first-layer grating, the second-layer grating, and the third-layer grating of the first cell 202*a* may be P, Q, R, respectively.

The second cell 202*b* may include a first-layer grating (e.g., a top grating) located on a first layer of the sample 104, a second layer-grating (e.g., a middle grating) located on a second layer of the sample 104, and a third-layer grating (e.g., a bottom grating) located on a third layer, where the gratings have different pitches. For example, the pitches of the first-layer grating, the second-layer grating, and the third-layer grating of the second cell 202*b* may be Q, P, R, respectively.

The third cell 202*c* may include a first-layer grating (e.g., a top grating) located on a first layer of the sample 104, a second layer-grating (e.g., a middle grating) located on a second layer of the sample 104, and a third-layer grating (e.g., a bottom grating) located on a third layer, where the gratings have different pitches. For example, the pitches of the first-layer grating 208, the second-layer grating 212, and the third-layer grating 216 of the third cell 202*c* may be R, Q, P respectively.

In embodiments, the TIS error may be determined based on the overlay error between one of the first cell 202*a*, the second cell 202*b*, or the third cell 202*c*. For example, in general, TIS correction by two layers is done by averaging measurements from two cells with inverted pitch distributions for those layers (e.g., PQ/QP, PR/RP, QR/RP). Determination of TIS errors is generally discussed in U.S. patent Ser. No. 18/099,798, filed on Dec. 20, 2023, which is incorporated by reference herein in the entirety. It is noted that not all may be necessary for every application, such that it may be sufficient to have two cells in some cases (rather than three as shown in FIGS. 6A-6B).

In embodiments, the method 500 includes simultaneously scanning multiple illumination beams and collecting the associated overlapping diffraction orders for parallel measurements.

In embodiments, the method 500 includes scanning one or more illumination beams along a beam-scan direction different than the stage-scan direction to provide a diagonal or triangle-wave path across the sample. In this regard, cells having multi-layer grating structures with different directions of periodicity may be efficiently interrogated by a common illumination beam in a measurement swath.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:

an illumination sub-system comprising:

an illumination source configured to generate an illumination beam; and one or more illumination optics configured to direct the illumination beam to an overlay target on a sample as the sample is scanned relative to the illumination beam along a scan direction when implementing a metrology recipe, wherein the overlay target in accordance with the metrology recipe includes three cells, the three cells comprising a first cell having a first multi-layer grating structure formed as a first-layer grating on a first layer with a first pitch, a second-layer grating on a second layer with a second pitch, and a third-layer grating on a third layer with a third pitch, wherein the first pitch, the second pitch, and the third pitch are different from one another; a second cell having a second multi-layer grating structure formed as a first-layer grating on the first layer with the second pitch, a second-layer grating on the second layer with the first pitch, and a third-layer grating on the third layer with the third pitch; and a third cell having a third multi-layer grating structure formed as a first-layer grating on the first layer with the third pitch, a second-layer grating on the second layer with the second pitch, and a third-layer grating on the third layer with the first pitch, and wherein the overlapping grating structures are periodic along at least one of the scan direction or a direction orthogonal to the scan direction;

a collection sub-system comprising:

a first photodetector located in a pupil plane at a first location to capture overlapping diffraction orders from the multi-layer grating structures in the one or more cells when implementing the metrology recipe; and a second photodetector located in the pupil plane at a second location to capture overlapping diffraction orders from the multi-layer grating structures in the three cells when implementing the metrology recipe; and a controller communicatively coupled to the first photodetector and the second photodetector, the controller including one or more processors configured to execute program instructions causing the one or more processors to:

receive time-varying interference signals from the first photodetector and the second photodetector associated with the multi-layer grating structures in the three cells as the overlay target is scanned in accordance with the metrology recipe; and determine an overlay error between one of the first layer, the second layer, or the third layer of the sample based on the time-varying interference signals.

2. The overlay metrology system of claim 1, wherein the controller is configured to execute the program instructions causing the one or more processors to execute the metrology recipe by:

determining a tool induced shift (TIS) error of the overlay target based on a difference between one of an overlay measurement of the first cell, an overlay measurement of the second cell, or an overlay measurement of the third cell.

3. The overlay metrology system of claim 1, wherein the first location including the first photodetector includes a location of +1 grating order diffraction associated with grating diffraction from the overlapping grating structures of the multi-layer grating structures and 0-order diffraction, wherein the second location including the second photodetector includes a location of −1 grating order diffraction associated with grating diffraction from the overlapping grating structures of the multi-layer grating structures and 0-order diffraction.

4. The overlay metrology system of claim 1, wherein the one or more processors are further configured to execute program instructions causing the one or more processors to:

extract at least one of intensity or phase information associated with the time-varying interference signals using a frequency-domain analysis technique; and determine the overlay error between the first layer and the second layer of the sample based on the at least one of intensity or phase information.

5. The overlay metrology system of claim 1, wherein the one or more illumination optics direct the illumination beam to the overlay target at a normal incidence angle.

6. The overlay metrology system of claim 1, wherein the illumination beam comprises:

a spatially coherent illumination beam.

7. The overlay metrology system of claim 1, further comprising:

a translation stage to translate the sample along the scan direction, wherein the one or more illumination optics direct the illumination beam to the overlay target on the sample as the sample is scanned by the translation stage.

8. The overlay metrology system of claim 1, further comprising:

one or more beam-scanning optics to scan the illumination beam along the scan direction.

9. An overlay metrology target comprising:

a multi-layer grating structure formed as an overlapping grating structure, wherein the overlapping grating structure including three cells, the three cells comprising a first cell having a first multi-layer grating structure formed as a first-layer grating on a first layer with a first pitch, a second-layer grating on a second layer with a second pitch, and a third-layer grating on a third layer with a third pitch, wherein the first pitch, the second pitch, and the third pitch are different from one another; a second cell having a second multi-layer grating structure formed as a first-layer grating on the first layer with the second pitch, a second-layer grating on the second layer with the first pitch, and a third-layer grating on the third layer with the third pitch; and a third cell having a third multi-layer grating structure formed as a first-layer grating on the first layer with the third pitch, a second-layer grating on the second layer with the second pitch, and a third-layer grating on the third layer with the first pitch, and wherein the overlapping grating structures are periodic along at least one of a scan direction or a direction orthogonal to the scan direction.

10. A method comprising:

receiving time-varying interference signals from first and second photodetectors associated with a multi-layer grating structure in one or more cells as an overlay target is scanned in accordance with a metrology recipe, wherein the overlay target in accordance with the metrology recipe includes three cells, the three cells comprising a first cell having a first multi-layer grating structure formed as a first-layer grating on a first layer with a first pitch, a second-layer grating on a second layer with a second pitch, and a third-layer grating on a third layer with a third pitch, wherein the first pitch, the second pitch, and the third pitch are different from one another; a second cell having a second multi-layer grating structure formed as a first-layer grating on the first layer with the second pitch, a second-layer grating on the second layer with the first pitch, and a third-layer grating on the third layer with the third pitch; and a third cell having a third multi-layer grating structure formed as a first-layer grating on the first layer with the third pitch, a second-layer grating on the second layer with the second pitch, and a third-layer grating on the third layer with the first pitch, and wherein the overlapping grating structures are periodic along at least one of a scan direction or a direction orthogonal to the scan direction; and determining an overlay error between one of the first layer, the second layer, or the third layer of a sample based on the time-varying interference signals.

* * * * *